(12) United States Patent
Kang et al.

(10) Patent No.: US 8,441,416 B2
(45) Date of Patent: May 14, 2013

(54) ACTIVE MATRIX ELECTROLUMINESCENT DISPLAY APPARATUS

(75) Inventors: Tae-Wook Kang, Suwon-si (KR); Chang-Soo Kim, Suwon-si (KR); Chang-Yong Jeong, Suwon-si (KR)

(73) Assignee: Samsung Display Co., Ltd. (KR)

( * ) Notice: Subject to any disclaimer, the term of this patent is extended or adjusted under 35 U.S.C. 154(b) by 1124 days.

(21) Appl. No.: 11/167,436

(22) Filed: Jun. 27, 2005

(65) Prior Publication Data

US 2006/0017393 A1    Jan. 26, 2006

(30) Foreign Application Priority Data

Jun. 26, 2004    (KR) .................. 10-2004-0048648

(51) Int. Cl.
    *G09G 3/30*    (2006.01)
(52) U.S. Cl.
    USPC .............................................. 345/76; 345/82
(58) Field of Classification Search .............. 345/76–83
    See application file for complete search history.

(56) References Cited

U.S. PATENT DOCUMENTS

| 4,775,861 | A | 10/1988 | Saito et al. |
| 6,392,617 | B1 * | 5/2002 | Gleason ........................ 345/82 |
| 6,522,079 | B1 | 2/2003 | Yamada |
| 6,768,482 | B2 | 7/2004 | Asano et al. |
| 6,909,409 | B2 | 6/2005 | Tanada |
| 7,019,717 | B2 * | 3/2006 | Yumoto et al. .................. 345/76 |
| 7,230,594 | B2 * | 6/2007 | Miller et al. ..................... 345/82 |
| 2001/0015626 | A1 | 8/2001 | Ozawa |
| 2001/0022565 | A1 * | 9/2001 | Kimura ........................... 345/82 |
| 2003/0052618 | A1 | 3/2003 | Ishizuka |
| 2003/0189410 | A1 | 10/2003 | Yamazaki et al. |
| 2003/0205968 | A1 | 11/2003 | Chae et al. |
| 2004/0108978 | A1 * | 6/2004 | Matsueda et al. ............... 345/76 |
| 2004/0113875 | A1 | 6/2004 | Miller et al. |
| 2004/0227698 | A1 * | 11/2004 | Yamazaki et al. .............. 345/32 |
| 2005/0186839 | A1 | 8/2005 | Matsueda et al. |

FOREIGN PATENT DOCUMENTS

| EP | 1255240 A | 11/2002 |
| JP | 11-024604 | 1/1999 |
| JP | 11-272233 | 10/1999 |
| JP | 2001-109405 | 4/2001 |
| JP | 2002-040990 | 2/2002 |
| JP | 2002-149112 | 5/2002 |
| JP | 2002-221917 | 8/2002 |
| JP | 2004-139970 | 5/2004 |
| JP | 2004-006341 | 8/2004 |
| KR | P2000-0068316 | 11/2000 |

(Continued)

OTHER PUBLICATIONS

Japanese Office Action dated May 19, 2008 in Japanese Patent Application 2005-173683.

(Continued)

*Primary Examiner* — Michael Pervan
(74) *Attorney, Agent, or Firm* — Knobbe Martens Olson & Bear LLP

(57) ABSTRACT

Provided is an active matrix electroluminescent display apparatus in which a short circuit between a power line and data line in adjacent sub-pixels can be substantially prevented. The active matrix electroluminescent display apparatus includes: a power line; a first transistor positioned on a side of the power line and connected to the power line; a second transistor positioned on the other side of the power line and connected to the power line; and electroluminescent devices respectively connected to the first transistor and the second transistor.

11 Claims, 18 Drawing Sheets

FOREIGN PATENT DOCUMENTS

WO      WO 98/36407      8/1998

OTHER PUBLICATIONS

Office Action for corresponding Japanese Application No. 2009-25808 dated Nov. 9, 2010.

Office Action dated May 15, 2012 in corresponding Japanese Patent Application No. 2009-296305.

Office Action dated Mar. 5, 2013 in Divisional Japanese Patent Application No. 2009-296305.

\* cited by examiner

ACTIVE MATRIX ELECTROLUMINESCENT DISPLAY APPARATUS

CROSS-REFERENCE TO RELATED PATENT APPLICATIONS

This application claims the benefit of Korean Patent Application No. 10-2004-0048648, filed on Jun. 26, 2004, in the Korean Intellectual Property Office, the disclosure of which is incorporated herein in its entirety by reference.

BACKGROUND OF THE INVENTION

1. Field of the Invention

The present invention relates to an active matrix eletroluminescent display apparatus, and more particularly, to an active matrix electroluminescent display apparatus in which a short circuit between a power line and a data line in adjacent sub-pixels is substantially prevented.

2. Description of the Related Technology

FIG. 1 is a circuit diagram of a conventional active matrix electroluminescent display apparatus. FIG. 2 is an enlarged circuit diagram of a portion "A" of FIG. 1. FIG. 3 is an enlarged layout view of the portion "A" of FIG. 1.

Referring to FIGS. 1 through 3, a gate terminal 11 of a switching transistor 10 is connected to a scan line 30 connected to a scan driver (not shown), one terminal 12 of the switching transistor 10 is connected to a data line 20 connected to a data driver (not shown), the other terminal 13 of the switching transistor 10 is connected to a gate terminal 51 of a driving transistor 50 and a first capacitor terminal 41 of a storage capacitor 40, a second capacitor terminal 42 of the storage capacitor 40 and one terminal 52 of the driving transistor 50 is connected to a power line 70, and the other terminal 53 of the driving transistor 50 is connected to a pixel terminal 61 of an electroluminescent device 60.

When a scan signal is applied to the gate terminals 11 of the switching transistors 10 in a selected row connected to scan lines 30, current flows from the one terminal 12 to the other terminal 13 of transistor 10. In this case, current is provided to the terminals 12 of only the selected switching transistors 10 through the data lines 20 sub-pixel.

In this case, current flowing in each selected sub-pixel emitting light is supplied through the power line 70. Therefore, a constant voltage is applied to the power line 70 sub-pixel.

However, in this conventional structure, the data line 20 and the power line 70 are arranged as a pair in close proximity to each other, so that a short circuit is likely to occur between the data line 20 and the power line 70. When a short circuit occurs between the data line 20 and the power line 70 the proper data cannot be driven onto data line 20. As a result, sub-pixels which have not to be selected are erroneously selected and emit light.

SUMMARY OF CERTAIN INVENTIVE ASPECTS

The present invention provides an active matrix electroluminescent display apparatus in which a short circuit between a power interconnection line and a data line in adjacent sub-pixels can be substantially prevented.

According to an aspect of the present invention, there is provided an active matrix electroluminescent display apparatus including: first and second electroluminescent devices, a first transistor positioned adjacent to the first transistor and connected to the second electroluminescent device, and a power line positioned between the first and second transistors. The power line is configured to provide current to the first and second transistors The apparatus may further include: a third transistor electrically connected to the first transistor; and a fourth transistor electrically connected to the second transistor.

The apparatus may further include: a first line electrically connected to the third transistor; and a second line electrically connected to the fourth transistor.

The apparatus may further include a first sub-pixel including the first transistor, the electroluminescent device electrically connected to the first transistor, and the third transistor is interposed between the power line and the first line; and a second sub-pixel including the second transistor, the electroluminescent device electrically connected to the second transistor, and the fourth transistor is interposed between the power line and the second line.

The first sub-pixel and the second sub-pixel may be symmetric with respect to the power line.

The first transistor and the second transistor may have different sizes.

The electroluminescent devices electrically connected to the first transistor and the second transistor may have different sizes.

According to another aspect of the present invention, there is provided an active matrix electroluminescent display apparatus including: first and second electroluminescent devices, a first transistor connected to the first electroluminescent device, a second transistor positioned adjacent to the first transistor and connected to the second electroluminescent device, and first and second substantially parallel power lines positioned between the first and second transistors. The first power line is configured to provide current to the first transistor and the second power line is configured to provide current to the second transistor.

The apparatus may further include: a third transistor electrically connected to the first transistor; and a fourth transistor electrically connected to the second transistor.

The apparatus may further include: a first line electrically connected to the third transistor; and a second line electrically connected to the fourth transistor.

The apparatus may further include: a first sub-pixel comprising the first transistor, the electroluminescent device electrically connected to the first transistor, and the third transistor is positioned between the first power line and the first line; and a second sub-pixel comprising the second transistor, the electroluminescent device electrically connected to the second transistor, and the fourth transistor is positioned between the second power line and the second line.

The first sub-pixel and the second sub-pixel may be symmetric with respect to the first power line and the second power line.

The first transistor and the second transistor may have different sizes.

The electroluminescent devices electrically connected to the first transistor and the second transistor may have different sizes.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Figure 1:
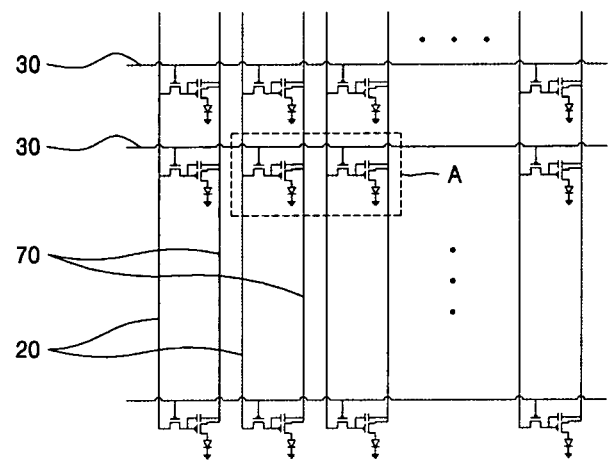
FIG. 1 is a circuit diagram of a conventional active matrix electroluminescent display apparatus (Prior Art)
Figure 2:
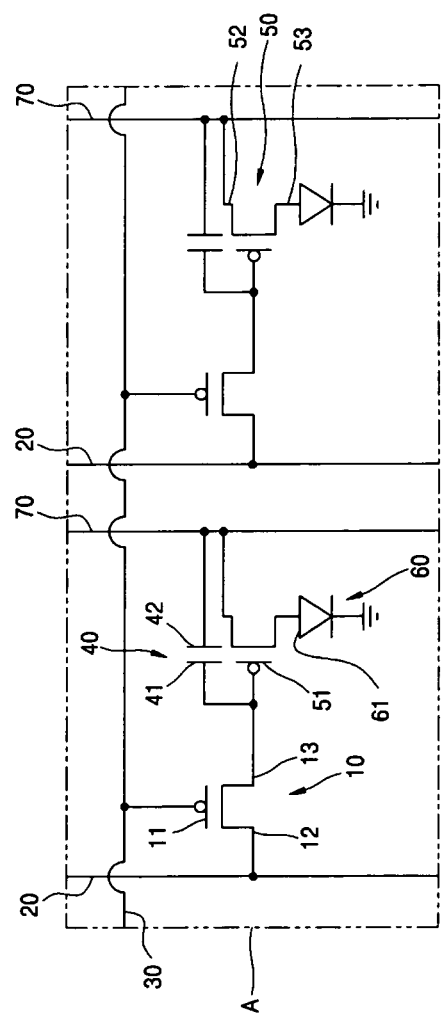
FIG. 2 is an enlarged circuit diagram of a portion A of FIG. 1 (Prior Art)
Figure 3:
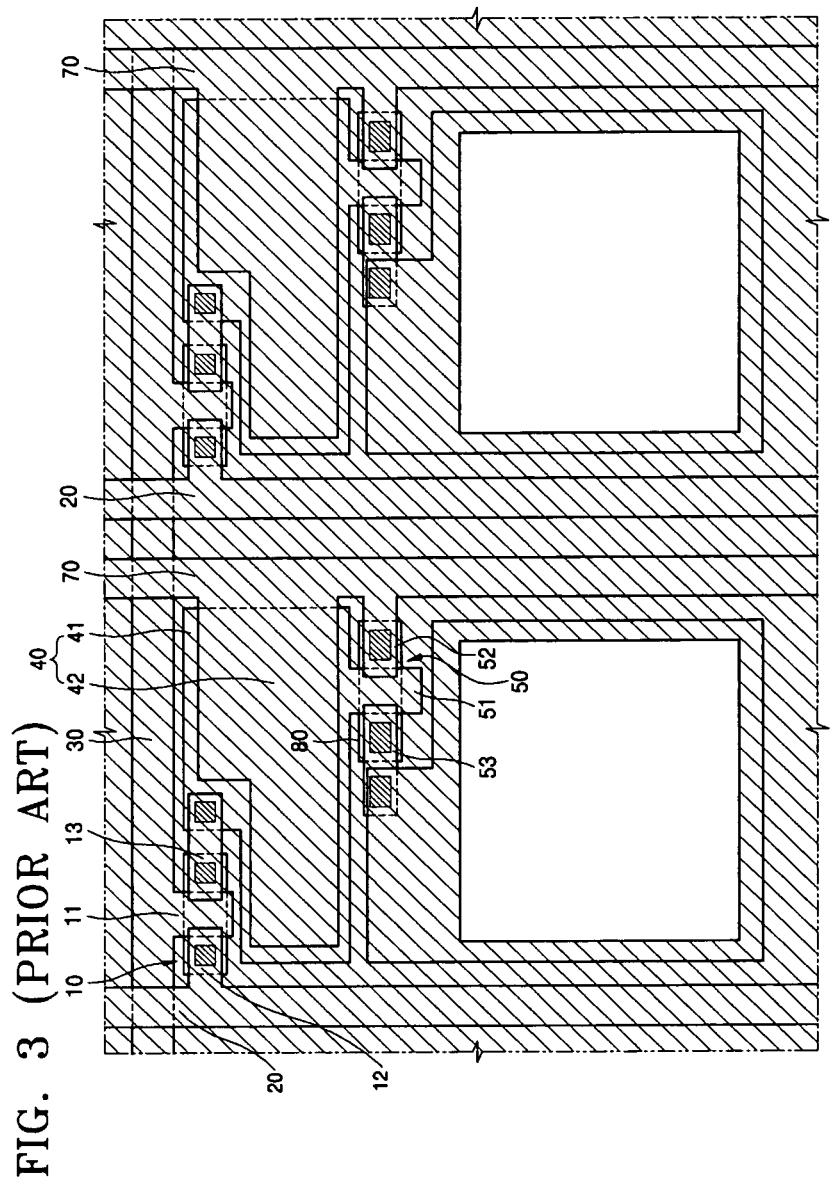
FIG. 3 is an enlarged layout view of the portion A of FIG. 1 (Prior Art)
Figure 4:
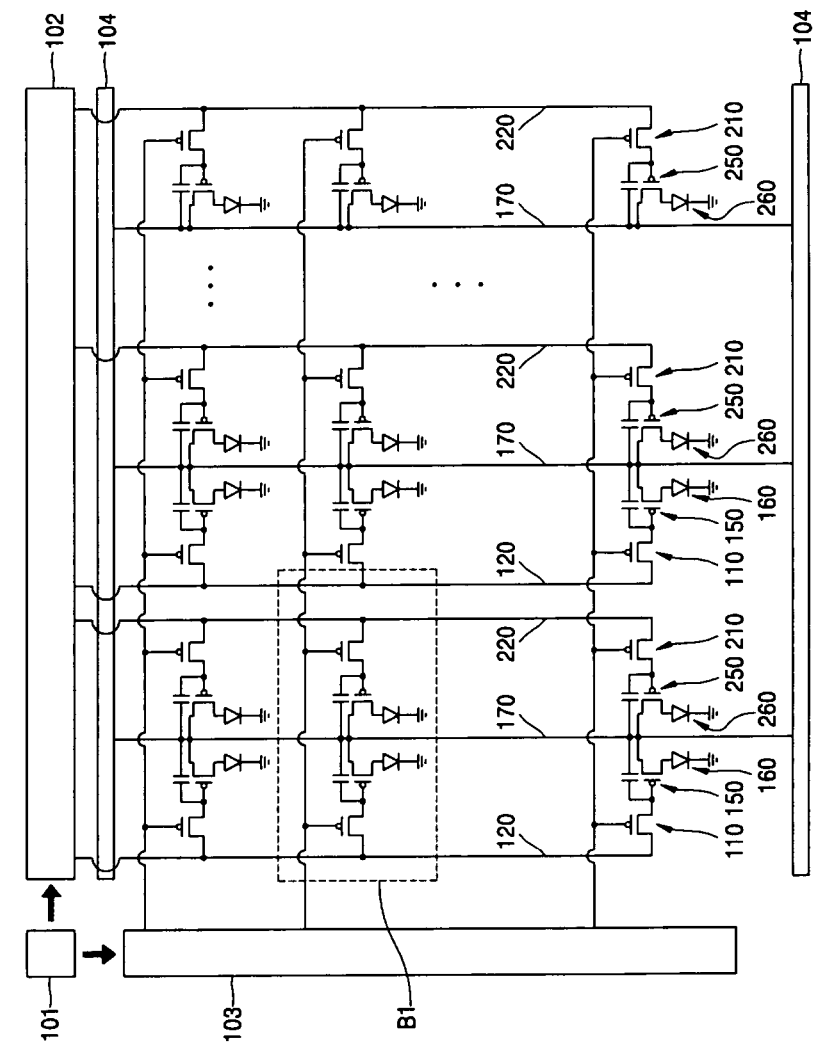
FIG. 4 is a circuit diagram of an active matrix electroluminescent display apparatus according to an embodiment of the present invention.
Figure 5:
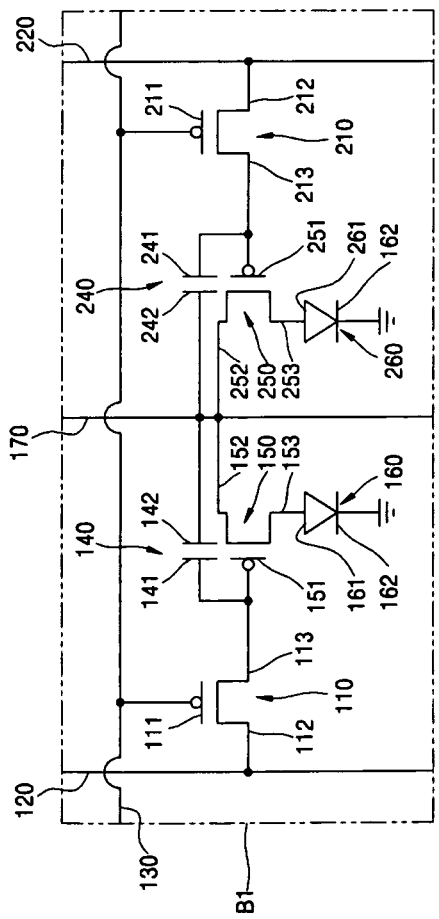
FIG. 5 is an enlarged circuit diagram of a portion B1 of FIG. 4.
Figure 6:
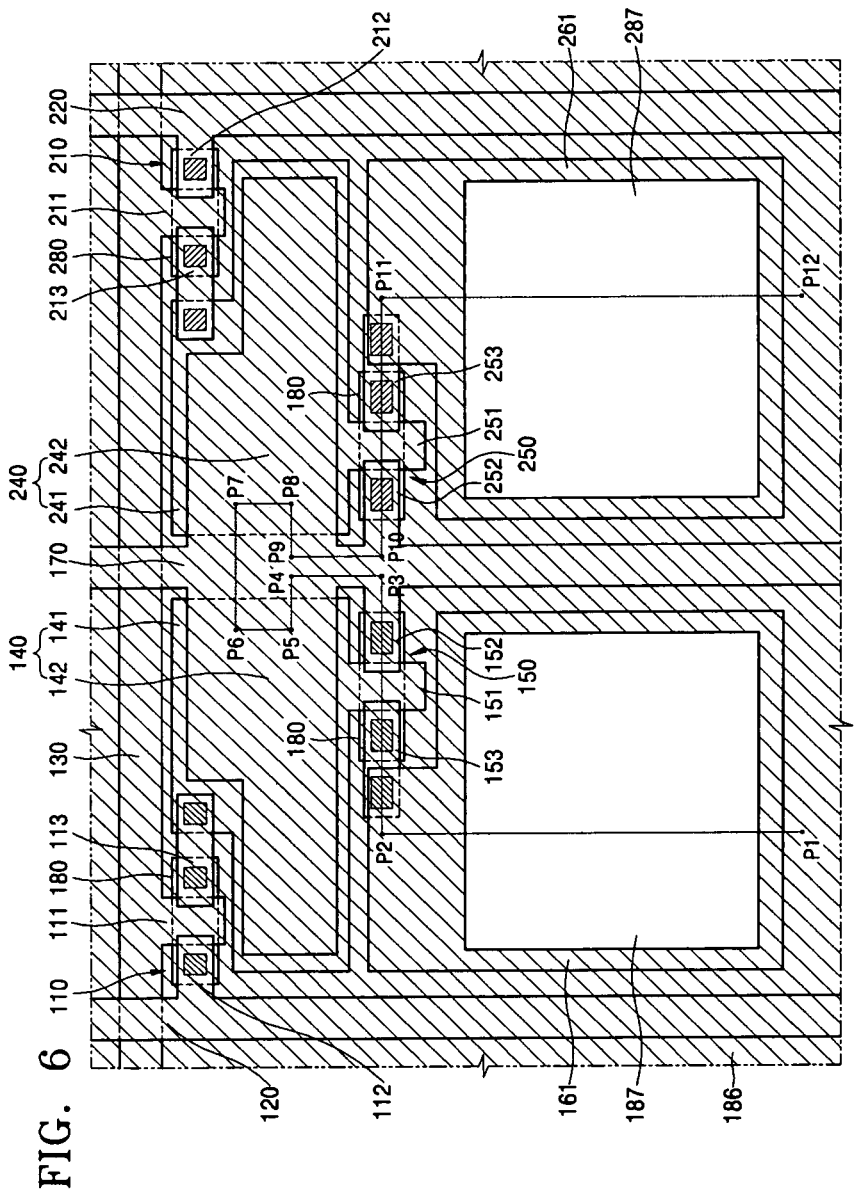
FIG. 6 is an enlarged layout view of the portion B1 of FIG. 4.
Figure 7:
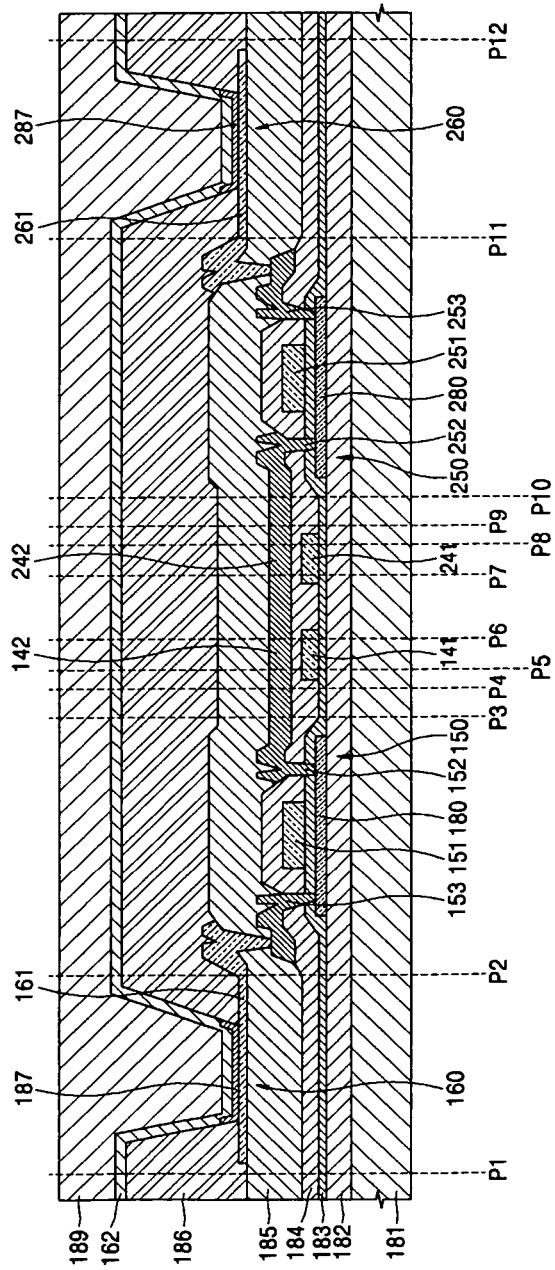
FIG. 7 is a cross-sectional view taken along a line connecting points P1 through P12 of FIG. 6.

The following detailed description is directed to certain specific embodiments of the invention. However, the invention can be embodied in a multitude of different ways. In this description, reference is made to the drawings wherein like parts are designated with like numerals throughout. The term "on" as used herein is does not necessarily mean physically touching. FIG. 4 is a circuit diagram of an active matrix electroluminescent display apparatus according to an embodiment of the present invention. FIG. 5 is an enlarged circuit diagram of a portion B1 of FIG. 4. FIG. 6 is an enlarged layout view of the portion B1 of FIG. 4. FIG. 7 is a cross-sectional view taken along a line connecting points P1 through P12 of FIG. 6.

Such an apparatus may be used in cell phones, televisions, computer monitors, game displays.

Electroluminescence display apparatuses include various pixel arrangements according to the color of light generated in their emission layer. For example, each pixel includes red, green, and blue sub-pixels. Each sub-pixel in such an electroluminescent display apparatus is a current-driven eletroluminescent device emitting light of red, green, or blue color as current flows terminal through it in order to form part of a predetermined image.

Electroluminescence display devices include LED's, plasma display elements.

An electroluminescent display apparatus may include a pixel terminal, an intermediate layer including at least an emissive layer formed above the pixel terminal, and an opposite terminal formed above the intermediate layer. However, the present invention is not limited to this structure, and electroluminescent display apparatuses according to the present invention may have various structures.

Referring to FIG. 5, a first transistor 150 and the second transistor 250 are positioned on opposing sides of a power line 170, and are connected to the power line 170. An electroluminescent device 160 is electrically connected to the first transistor 150, and an electroluminescent device 260 is electrically connected to the second transistor 250. That is, adjacent sub-pixels arranged adjacent to the power line 170 share one power line 170.

Since two sub-pixels share one power line 170, the power line 170 is not adjacent to other lines for selecting sub-pixels. Accordingly, a short circuit between the power line 170 and other lines and a malfunction of sub-pixels can be substantially prevented.

Referring to FIG. 5, a third transistor 110 is further electrically connected to the first transistor 150. A fourth transistor 210 is further electrically connected to the second transistor 250. A first storage capacitor 140 is further electrically connected to the first transistor 150 and the third transistor 110. A second storage capacitor 240 is electrically connected to the second transistor 250 and the fourth transistor 210. In this case, a first line 120, a second line 220, and a third line 130 are further formed. The first line 120 is electrically connected to the third transistor 110, and the second line 220 is electrically connected to the fourth transistor 210. The third line 130 is electrically connected to the third transistor 110 and the fourth transistor 210.

The structure will be described in detail. A fifth terminal 112 of the third transistor 110 is connected to a driving circuit (not shown) by the first line 120, a third gate terminal 111 of the third transistor 110 is connected to a driving circuit by the third line 130, and a sixth terminal 113 of the third transistor 110 is connected to a first capacitor terminal 141 of the first storage capacitor 140 and a first gate terminal 151 of the first transistor 150.

A seventh terminal 212 of the fourth transistor 210 is connected to a driving circuit (not shown) by the second line 220, a fourth gate terminal 211 of the fourth transistor 210 is connected to a driving circuit (not shown) by the third line 130, an eighth terminal 213 of the fourth transistor 210 is connected to a first capacitor terminal 241 of the second storage capacitor 240 and a second gate terminal 251 of the second transistor 250.

In the above structure, the first line 120 and the second line 220 may be data lines for transmitting data signal, the third line 130 may be a scan line. In this case, the third transistor 110 and the fourth transistor 210 may act as switching transistors (TRs), and the first transistor 150 and the second transistor 250 may act as driving TRs. In a circuit having such a structure described above each sub-pixel may comprise at least two TRs and an electroluminescent device. Hereafter, a structure in which two transistors, i.e., a switching TR and a driving TR, and an electroluminescent device will be described, but the present invention is not limited to this embodiment.

A second capacitor terminal 142 of the first storage capacitor 140 and a first terminal 152 of the first TR 150 are connected to the power line 170, and a second terminal 153 of the first TR 150 is connected to a pixel terminal 161 of the electroluminescent device 160. As illustrated in FIG. 7 terminal the electroluminescent device 160 terminal comprises an intermediate layer 187 including at least an emissive layer is interposed between the pixel terminal 161 and the opposite terminal 162.

A second capacitor terminal 242 of the second storage capacitor 240 and a third terminal 252 of the second TR 250 are connected to the power line 170, and a fourth terminal 253 of the second TR 250 is connected to a pixel terminal 261 of the electroluminescent device 260. The structure of the electroluminescent device 260 is the same as described above.

FIGS. 6 and 7 illustrate a structure of the portion B1 of FIG. 4. FIG. 6 illustrates the first line 120, the second line 220, the third gate terminal 111, the fifth terminal 112, the sixth terminal 113, the fourth gate terminal 211, the seventh terminal 212, the eighth terminal 213, and the third line 130, which are not illustrated in FIG. 7. FIG. 7 illustrates a substrate 181, a buffer layer 182, a gate dielectric layer 183, an interlayer insulating layer 184, a first protecting layer 185, the opposite terminal 162, and a second protecting layer 189, which are not illustrated in FIG. 6.

When a scan signal is applied to the third gate terminal 111 by a driving circuit, a channel is formed in a semiconductor layer connecting the fifth terminal 112 and the sixth terminal 113, a data signal is transmitted through this channel from the first line 120 to the first capacitor 140 and the first TR 150. In response, a channel is formed in a semiconductor layer connecting the first terminal 152 and the second terminal 153, and a signal is transmitted through this channel from the power line 170 to the pixel terminal 161 of the electroluminescent device 160.

When a scan signal is applied to the fourth gate terminal 211 by the driving circuit, a conductive channel is formed in a semiconductor layer connecting the seventh terminal 212 and the eighth terminal 213, and a data signal is transmitted through this channel from the second line 220 to the second capacitor 240 and the second TR 250. In response, a channel is formed in a semiconductor layer connecting the third terminal 252 and the fourth terminal 253, and a signal is transmitted through this channel from the power line 170 to the pixel terminal 261 of the electroluminescent device 260.

A detailed structure of each sub-pixel will be described with reference to FIG. 7. Referring to FIG. 7, the electroluminescent device 160 is illustrated between P1 and P2, the electroluminescent device 260 is illustrated between P11 and P12, the first TR 150 is illustrated between P2 and P3, the second TR 250 is illustrated between P10 and P11, the first storage capacitor 140 is illustrated between P3 and P6, and the second storage capacitor 240 is illustrated between P7 and P10.

A buffer layer 182 can be formed on the entire upper surface of the substrate 181 to substantially prevent permeation of impurities into semiconductor layers 180 and 280 from the substrate 181 and to improve the surface evenness of the substrate 181. In this case, the first TR 150 and the second TR 250 are formed on the buffer layer 182. The first protecting layer 185 is formed to cover the first TR 150 and the second TR 250, and contact holes are formed in regions of the first protecting layer 185 that correspond to the second terminal 153 and the fourth terminal 253. Pixel terminals 161 and 261 are formed in the regions including the contact holes. The pixel terminals 161 and 261 are respectively connected to the second terminal 153 of the first TR 150 and the fourth terminal 153 of the second TR 250 through the contact holes formed in the first protecting layer 185.

Intermediate layers 187 and 287 including at least an emissive layer are respectively formed on the pixel terminals 161 and 261. The opposite terminal 162 is formed on the intermediate layers 187 and 287. The second protecting layer 189 may be formed on the opposite terminal 162.

In a rear emission type electroluminescent device, the substrate 181, the buffer layer 182, the gate dielectric layer 183, the interlayer insulating layer 184, the first protecting layer 185, and the pixel terminals 161 and 261 may be formed of transparent materials, and the opposite terminal 162 may be formed of a metal with a high reflectivity. Meanwhile, in a front emission type electroluminescent device, the pixel terminals 161 and 261 may be formed of a metal with a high reflectivity, and the opposite terminal 162 and the second protecting layer 189 may be formed of transparent materials.

An electroluminescent device according to the present invention can be a rear emission type, a front emission type, or a double-side emission type. Light generated in these electroluminescent device may be externally emitted through at least one of the pixel terminals 161 and 261 and the opposite terminal 162.

A transparent material for the pixel terminals 161 and 261 may be ITO, IZO, ZnO or $In_2O_3$. When the pixel terminals 161 and 261 are used as reflective terminals, the pixel terminals 161 and 261 can be formed by forming a reflecting layer using Ag, Mg, Al, Pt, Pd, Au, Ni, Nd, Ir, Cr or a compound of the forgoing materials and depositing ITO, IZO, ZnO or $In_2O_3$ on the reflecting layer. The pixel terminals 161 and 261 may have a pattern corresponding to a pattern of pixels as illustrated in FIGS. 4 through 7.

When a transparent material is used to form the opposite terminal 162, the opposite terminal 162 can be formed by depositing Li, Ca, LiF/Ca, LiF/Al, Al, Ag, Mg, or a compound of the forgoing materials on the intermediate layer 187 and forming on the intermediate layer 187 an auxiliary terminal line or a bus terminal line using a transparent material, such as ITO, IZO, ZnO, $In_2O_3$, or the like. When the opposite terminal 162 is used as a reflective terminal, Li, Ca, LiF/Ca, LiF/Al, Al, Ag, Mg, or a compound of the forgoing materials is formed on the entire surface of display apparatuses. However, materials for the pixel terminals 161 and 261 and the opposite terminal 162 are not limited to the above, and organic materials, such as a conductive polymer, can be used to form the pixel terminals 161 and 261 and the opposite terminal 162. In addition, the opposite terminal 162 may be formed to cover all the pixels or to correspond to each of the pixels.

The electroluminescent devices 160 and 260 include the intermediate layers 187 and 287, respectively, between the pixel terminals 161 and 261, which are electrically connected to the second terminal 153 of the first TR 150 and the fourth terminal 253 of the second TR 250, respectively, and the opposite terminal 162 facing the pixel terminals 161 and 261. Each of the electroluminescent devices is categorized into either an organic electroluminescent device or an inorganic electroluminescent device according to the material used to form the intermediate layer 187.

In organic electroluminescent devices, the intermediate layer 187 is may be composed of a low molecular weight organic material layer or a large molecular weight organic material layer.

When a low molecular weight organic material layer is used, the intermediate layer 187 may be formed of a layer selected from among a hole injection layer (HIL), a hole transport layer (HTL), an emission layer (EML), an electron transport layer (ETL), an electron injection layer (EIL), or a composite layer of these layers. Examples of the low molecular weight organic material that can be used may include copper phthalocyanine (CuPc), N,N'-Di(naphthalene-1-yl)-

N,N'-diphenyl-benzidine (NPB), tris-8-hydroxyquinoline aluminum (Alq3), and the like.

Such a low molecular weight organic material layer can be formed by thermally depositing an organic material in a vacuum condition. However, the structure of the intermediate layer 187 formed using such a low molecular weight organic material is not limited to the above and can be varied into various structures if required. When a large molecular weight organic material layer is used, the intermediate layer 187 may include a HTL and an EML. A large molecular weight HTL may be formed using poly-(2,4)-ethylene-dihydroxy thiophene (PEDOT), polyaniline (PANI), or the like by inkjet-printing or spin-coating. A large molecular weight EML may be formed as a color pattern using PPV, soluble PPV, cyano-PPV, polyfluorene, or the like by inkjet-printing, spin-coating, thermal transferring using laser, etc. However, the structure of the intermediate layer 187 formed of such a large molecular weight organic layer is not limited to the above and can be varied into various structures if required.

In inorganic electroluminescent devices, the intermediate layer 187 is composed of an inorganic material. The intermediate layer 187 may include an EML and an insulating layer interposed between the EML and the terminal. However, the structure of the intermediate layer 187 is not limited to this structure and can be varied into various structures if required.

The EML of the inorganic electroluminescent device may be composed of a metal sulfide, such as ZnS, SrS, CaS, etc.; alkali earth potassium sulfide, such as $CaGa_2S_4$, $SrGa_2S_4$, etc.; or a transition metal, such as Mn, Ce, Tb, Eu, Tm, Er, Pr, Pb, etc, or an alkali rare earth metal.

The first storage capacitor 140 includes the first capacitor terminal 141 and the second capacitor terminal 142. The first capacitor terminal 141 can be integrally formed with the first gate terminal 151. The second capacitor terminal 142 can be integrally formed with the first terminal 152. The second storage capacitor 240 includes the first capacitor terminal 241 and the second capacitor terminal 242. The first capacitor terminal 241 can be integrally formed with the second gate terminal 251. The second capacitor terminal 242 can be integrally formed with the third terminal 252 in a single body. In the present embodiment, two adjacent sub-pixels on opposite sides of the power line 170 share the one power line 170. Therefore, the second capacitor terminal 142 of the first capacitor 140 and the second capacitor terminal 242 of the second capacitor 240 can be integrally formed, as illustrated in FIGS. 6 and 7. The storage capacitors 140 and 240 maintain signals to the pixel terminals 161 and 261.

In the above-described structures, the electroluminescent devices 160 and 260 may be formed within gaps in the pixel defining layer 186, the gaps defining emitting regions. As illustrated in FIG. 7, the pixel defining layer 186 is formed terminal above intermediate layers 187 and 287. The gaps in the pixel defining layer 186 can then be formed so that they are smaller than the width of the pixel electrodes 161 and 261. The intermediate layers 187 and 287 and the opposite electrode 162 are formed within the gaps. This structure minimizes the electric field strength between the edges of the pixel electrodes 161 and 261 and the opposite electrode 162, and therefore substantially preventing a short circuit between the pixel terminals 161 and 261 and the opposite terminal 162.

In the above-described structure, two adjacent sub-pixels on opposite sides of power line 170 share the one power line 170 so that the power line 170 is not adjacent to other lines for selecting sub-pixels, in particular, the first and second lines 120 and 220, which can be used as data lines. Therefore, a short circuit between the power line 170 and other lines, such as the first line 120 and the second line 220, can be substantially prevented, thus substantially preventing a malfunction of sub-pixels. Due to the structure described above, the number of power lines is reduced by half of that of conventional active matrix electroluminescent display apparatuses, thereby resulting in a simplified interconnection structure. A first sub-pixel including the first TR 150, the third TR 110, and the electroluminescent device 160 electrically connected to the first TR 150 may be interposed between the power line 170 and the first line 120. A second sub-pixel including the second TR 250, the fourth TR 210, and the electroluminescent device 260 electrically connected to the second TR 250 may be interposed between the power line 170 and the second line 220.

The first sub-pixel and the second sub-pixel may be symmetric about the power line 170, as illustrated in FIGS. 6 and 7. However, the first sub-pixel and the second sub-pixel may be arranged in a way different from the above and are not limited thereto. For example, the first sub-pixel and the second sub-pixel may be arranged not to be symmetric.

Figure 8:
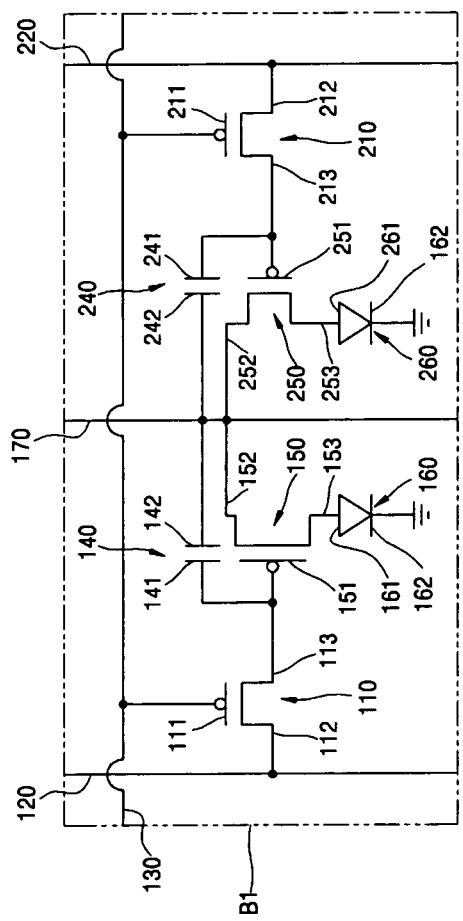
FIG. 8 is a modified circuit diagram of the portion B1 in FIG. 5.
Figure 9:
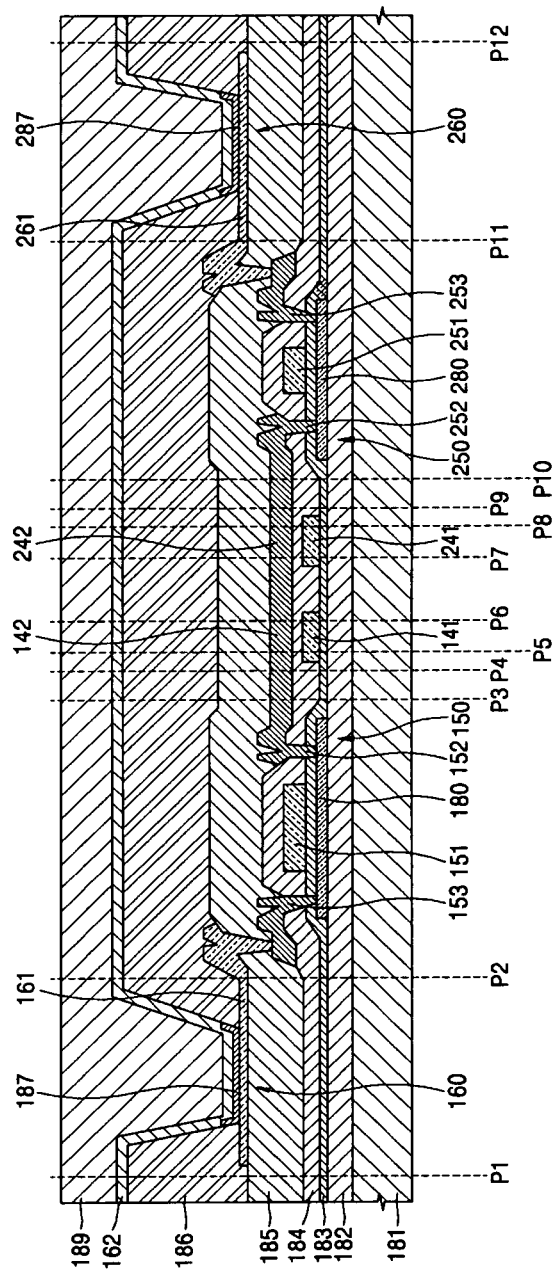
FIG. 9 is a cross-sectional view of an active matrix electroluminescent display apparatus including the portion B1 in FIG. 8.

FIG. 8 is a modified circuit diagram of FIG. 5, and FIG. 9 is a cross-sectional view of an active matrix electroluminescent display apparatus having the structure of FIG. 8. The active matrix electroluminescent display apparatus in FIGS. 8 and 9 differ from the active matrix electroluminescent display apparatuses in FIGS. 5 and 7 in that the first TR 150 and the second TRs 250 have different sizes. The electroluminescent devices 160 and 260 form images by emitting red, green, and blue light with a different luminous efficiency for each color of light. Accordingly, uniformity in, for example, luminous efficiency, can be improved by changing the size of the driving TR according to a high or low luminous efficiency.

Figure 10:
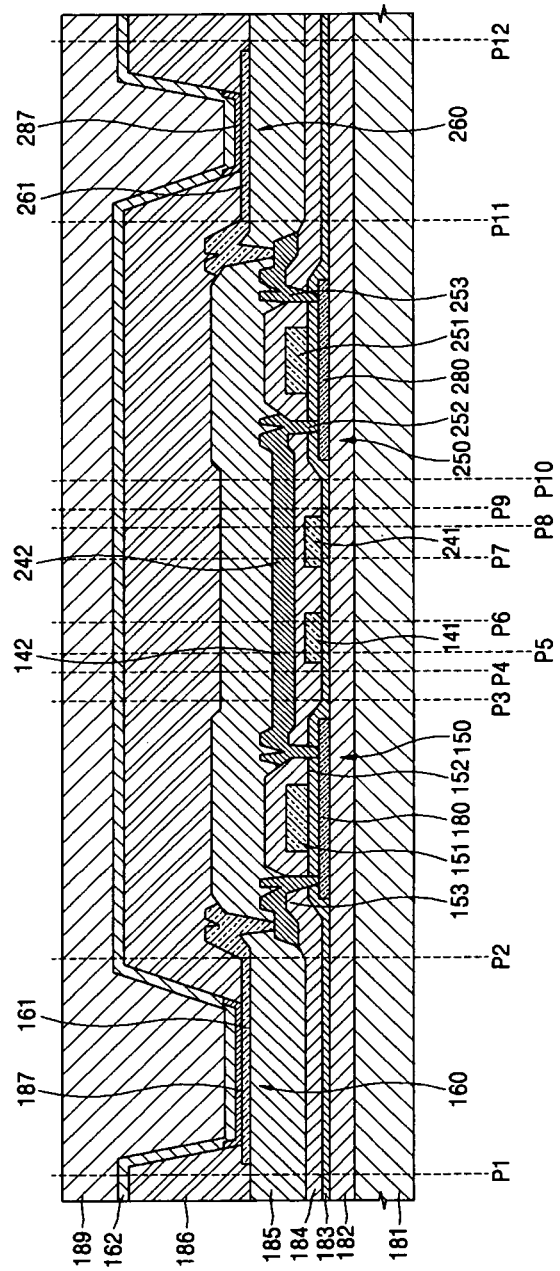
FIG. 10 is a cross-sectional view of an active matrix electroluminescent display apparatus having a structure modified from the structure in FIG. 7.

FIG. 10 is a modified cross-sectional view of the active matrix electroluminescent display apparatus of FIG. 7. The active matrix electroluminescent display apparatus of FIG. 10 differs from the active matrix electroluminescent display apparatus of FIG. 7 in that the electroluminescent device 160 electrically connected to the first TR 150 and the electroluminescent device 260 electrically connected to the second TR 250 have different sizes. That is, the difference in luminous efficiency between different colors of light can be compensated for by changing the size of the electroluminescent device according to the luminous efficiency of each color of light.

The modifications illustrated in FIGS. 8, 9, and 10 can be applied to the following embodiments.

Figure 11:
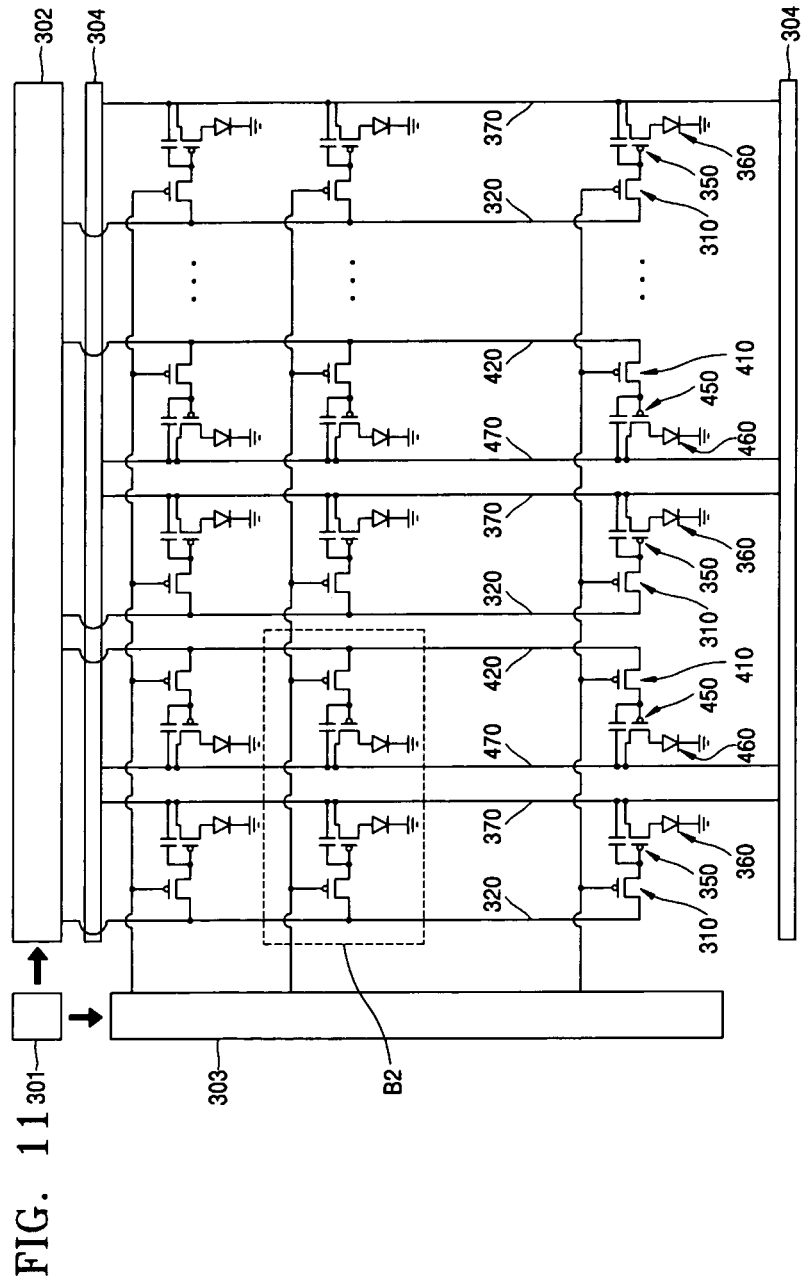
FIG. 11 is a circuit diagram of an active matrix electroluminescent display apparatus according to another embodiment of the present invention.
Figure 12:
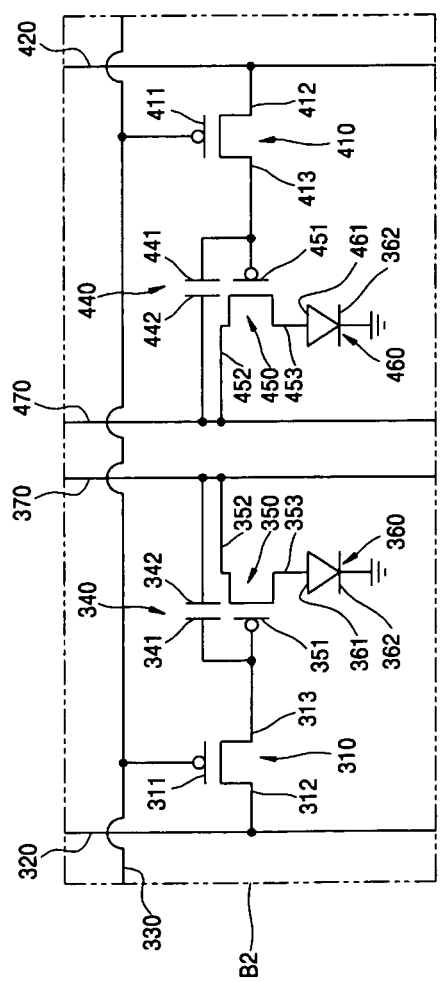
FIG. 12 is an enlarged circuit diagram of a portion B2 of FIG. 11.
Figure 13:
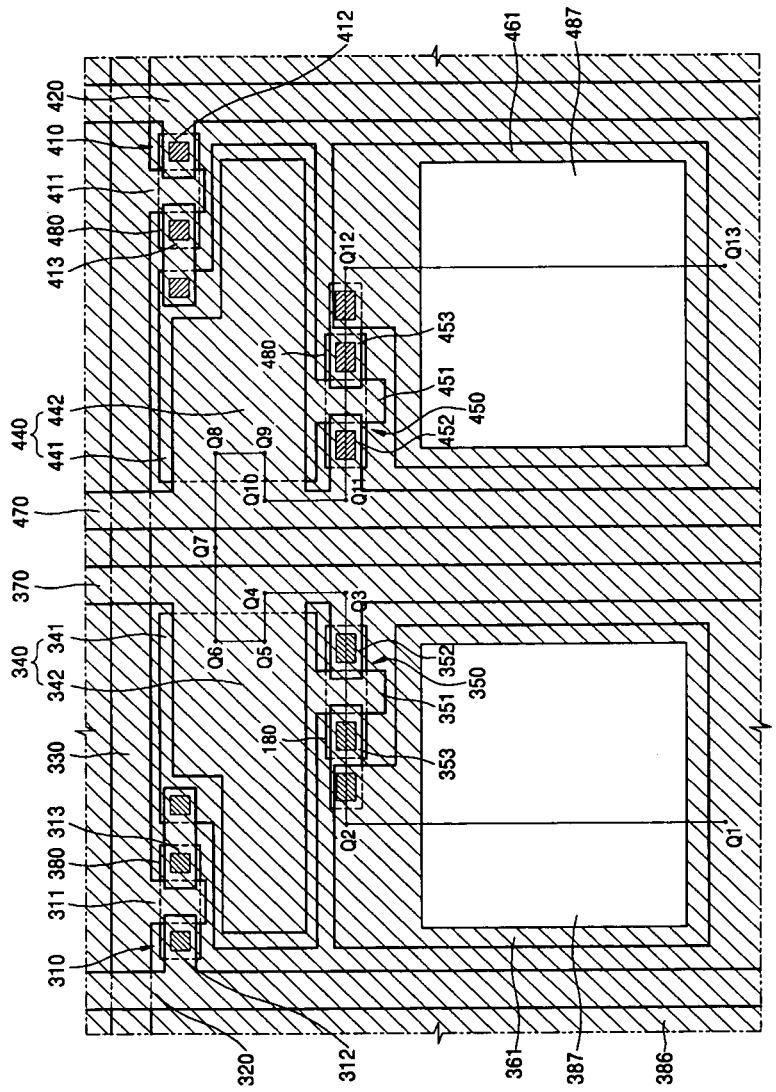
FIG. 13 is an enlarged layout view of the portion B2 of FIG. 11.
Figure 14:
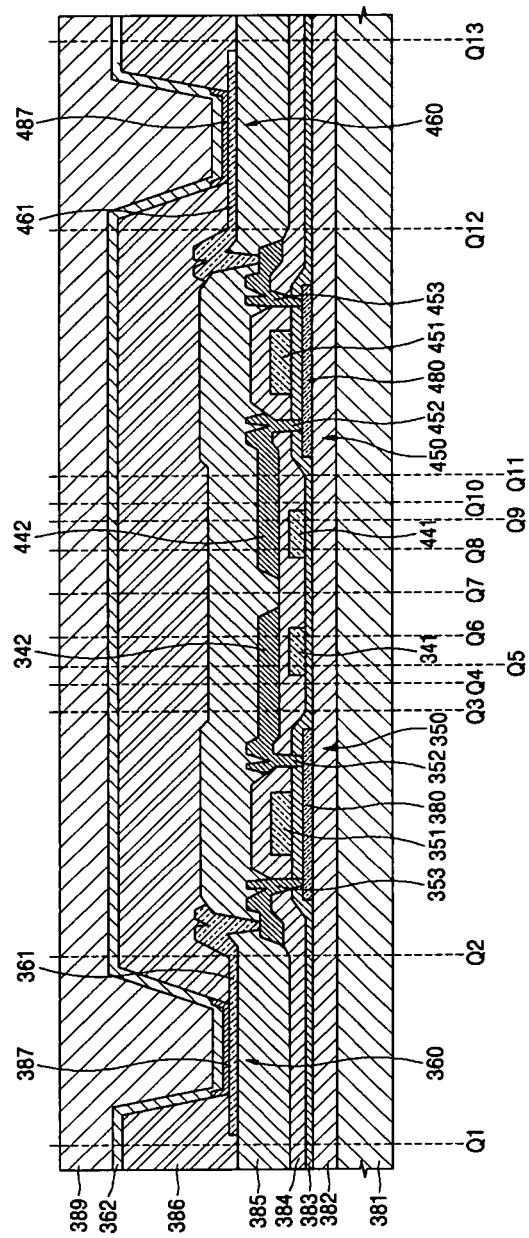
FIG. 14 is a cross-sectional view taken along a line connecting Q1 through Q13 of FIG. 13.
Figure 15:
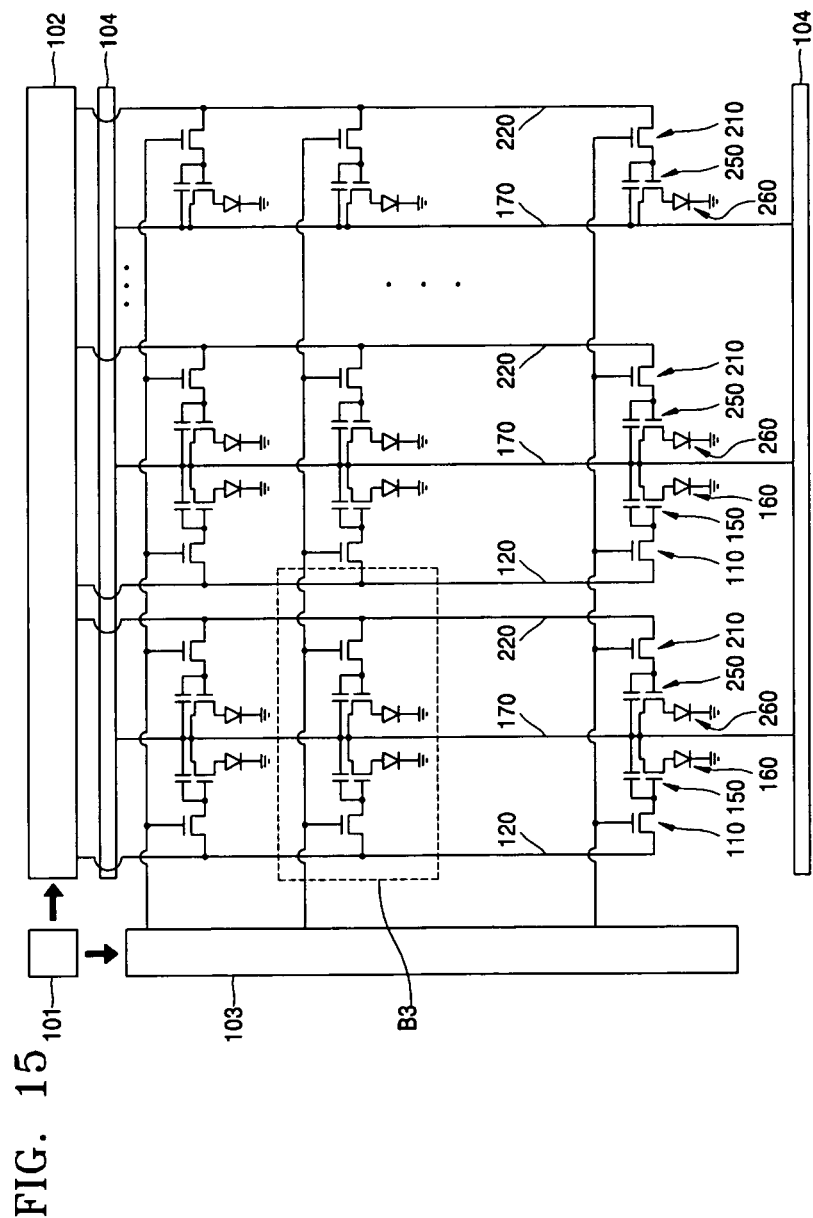
FIG. 15 is a circuit diagram of an active matrix electroluminescent display apparatus modified from the structure in FIG. 4.
Figure 16:
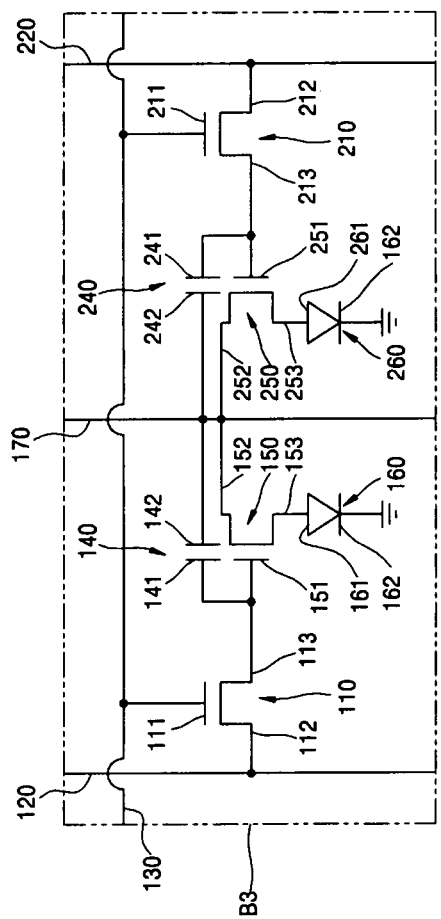
FIG. 16 is an enlarged circuit diagram of a portion B3 of FIG. 15.
Figure 17:
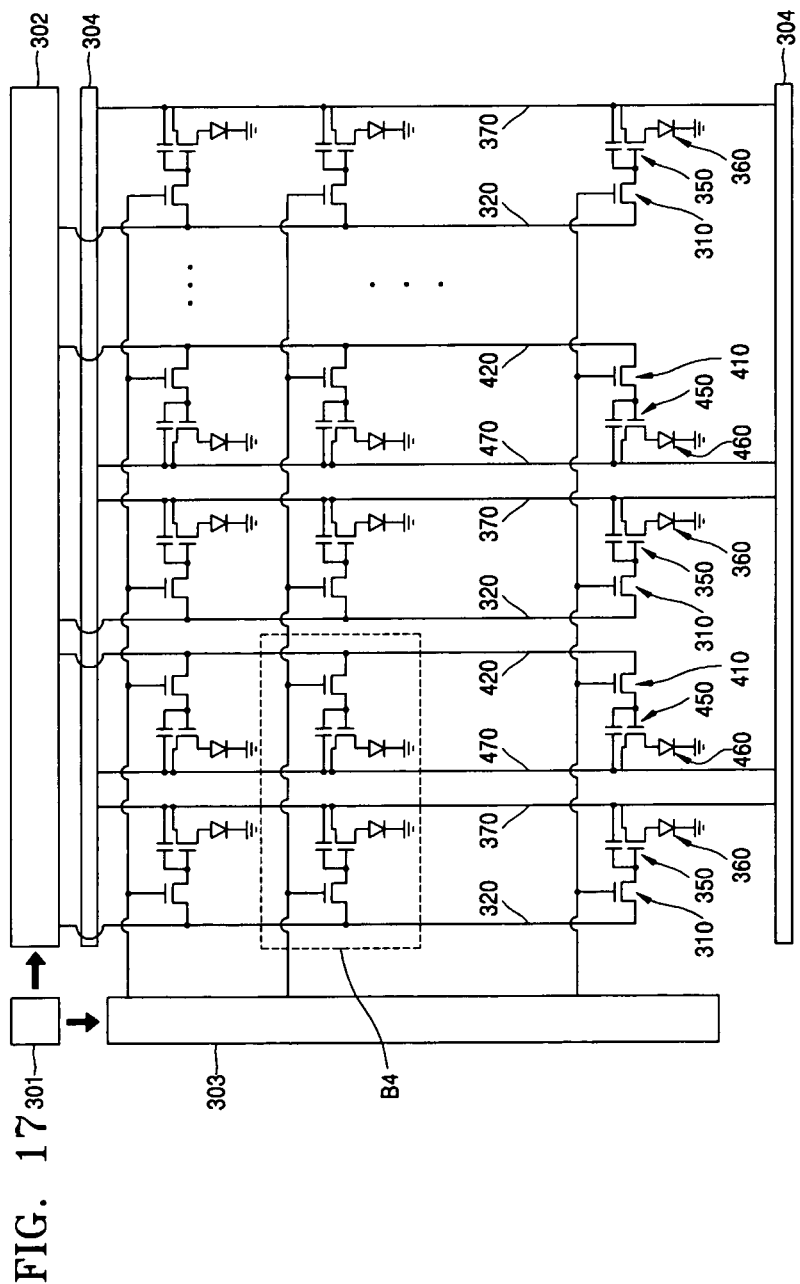
FIG. 17 is a circuit diagram of an active matrix electroluminescent display apparatus modified from the structure in FIG. 11.
Figure 18:
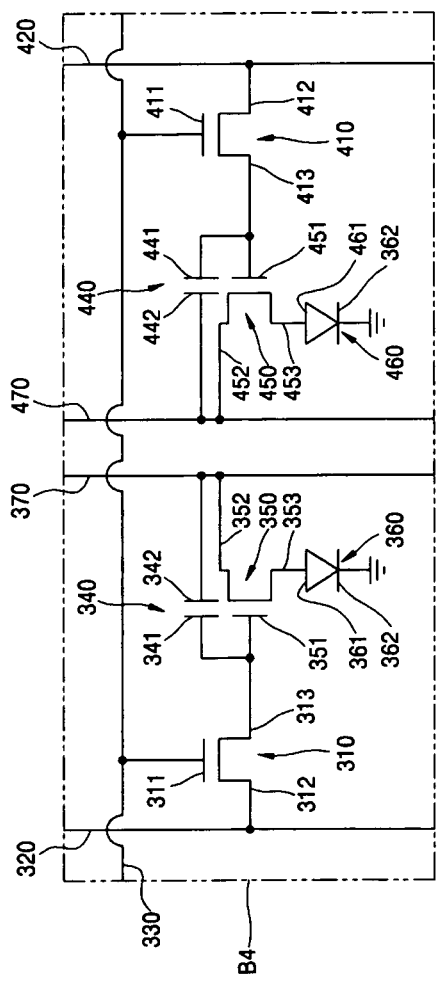
FIG. 18 is an enlarged circuit diagram of a portion B4 of FIG. 17.

FIG. 11 is a circuit diagram of an active matrix electroluminescent display apparatus according to another embodiment of the present invention. FIG. 12 is an enlarged circuit diagram of a portion B2 of FIG. 11. FIG. 13 is an enlarged layout view of the portion B2 of FIG. 11. FIG. 14 is a cross-sectional view of sub-pixels of the active matrix electroluminescent display apparatus of FIG. 13 taken along a line connecting points Q1 through Q13.

Referring to FIG. 11, a first power line 370 and a second power line 470 are arranged parallel to each other. A first TR 350 is positioned on a side away from the second power line 470 and is electrically connected to the first power line 370. A second TR 450 is positioned on a side away from the first power line 370 and is electrically connected to the second power line 470. An electroluminescent device 360 and an electroluminescent device 460 are respectively electrically connected to the first TR 350 and the second TR 450. In the above-described structure, the power lines 370 and 470 respectively connected to sub-pixels are positioned parallel to each other.

As described above, the power lines 370 and 470 connected to two sub-pixels and are not adjacent to other lines for selecting sub-pixels. As a result, a short circuit between the power lines 370 and 470 and the other lines is substantially prevented, thus substantially preventing a malfunction of sub-pixels. Also, in the above-described structure, since a the same voltage is applied to the power line 370 and the power line 470, there is no concern about a malfunction due to a short circuit between the power line 370 and the power line 470.

Referring to FIGS. 11 and 12, a third TR 310 electrically connected to the first TR 350 and a fourth TR 410 electrically connected to the second TR 450 are further included. A first storage capacitor 340 electrically connected to the first TR 350 and the third TR 310, and a second storage capacitor 440 electrically connected to the second TR 450 and the fourth TR 410 are further included. In this structure, a first line 320, a second line 420, and a third line 330 are further formed, wherein the first line 320 is connected to the third TR 310, and the second line 420 is connected to the fourth TR 410.

This structure will be described in detail with reference to FIGS. 12 and 13. A fifth terminal 312 of the third TR 310 is connected to a driving circuit (not shown) by the first line 320, a third gate terminal 311 of the third TR 310 is connected to a driving circuit (not shown) by the third line 330, and a sixth terminal 313 of the third TR 310 is electrically connected to a first capacitor terminal 341 of the first storage capacitor 340 and a gate terminal 351 of the first TR 350.

A seventh terminal 412 of the fourth TR 410 is connected to a driving circuit (not shown) by the second line 420, a fourth gate terminal 411 of the fourth TR 410 is connected to a driving circuit (not shown) by the third line 330, and an eighth terminal 413 of the fourth TR 410 is electrically connected to a first capacitor terminal 441 of the second storage capacitor 440 and a second gate terminal 451 of the second TR 450.

In such a structure described above, the first line 320 and the second line 420 may correspond to data lines for transmitting data, and the third line 330 may correspond to a scan line. In this case, the third TR 310 and the fourth TR 410 may act as switching TRs, and the first TR 350 and the second TR 450 may act as driving TRs. In such a circuit described above each sub-pixel may comprise at least two TRs and an electroluminescent device. Hereinafter, a case where two TRs, i.e., a switching TR and a driving TR, and an electroluminescent device, will be described.

A second capacitor terminal 342 of the first storage capacitor 340 and a first terminal 352 of the first TR 350 are connected to the first power line 370, and a second terminal 353 of the first TR 350 is connected to a pixel terminal 361 of the electroluminescent device 360. As illustrated in FIG. 14, an opposite terminal 362 of the electroluminescent device terminal comprises an intermediate layer 387 including at least an emission layer is interposed between the pixel terminal 361 and the opposite terminal 362.

A second capacitor terminal 442 of the second storage capacitor 440 and a third terminal 452 of the second TR 450 are connected to the second power line 470, and a fourth terminal 453 of the second TR 450 is connected to a pixel terminal 461 of the electroluminescent device 460. The electroluminescent device 460 may have the same structure as in the embodiment described above, and the principle of driving each sub-pixel may also be the same as in the embodiment described above.

A detailed structure of each sub-pixel will be described in brief with reference to FIG. 14. Referring to FIG. 14, the electroluminescent device 360 is illustrated between Q1 and Q2, the electroluminescent device 460 is illustrated between Q12 and Q13, the first TR 350 is illustrated between Q2 and Q3, the second TR 450 is illustrated between Q11 and Q12, the first storage capacitor 340 is illustrated between Q3 and Q7, and the second storage capacitor 440 is illustrated between Q7 and Q11.

In some embodiments two adjacent sub-pixels are respectively connected to separate power line sub-pixel. Unlike the illustration in FIG. 7, which is a cross-sectional view of the active matrix electroluminescent display apparatus according to a first embodiment of the present invention described above, referring to FIG. 14, which is a cross-sectional view of the active matrix electroluminescent display apparatus according to another embodiment of the invention, the second capacitor terminal 342 of the first storage capacitor 340 and the second storage capacitor terminal 442 of the second storage capacitor 440 are separated from each other, not integrally connected. Except for this structural difference, the active matrix electroluminescent display apparatus according to the present embodiment is structurally the same as the active matrix electroluminescent display apparatus according to the first embodiment described above.

As described above, the power line 370 and the power line 470, which are respectively connected to two sub-pixels are not adjacent to lines for selecting sub-pixels. Therefore, a short circuit between the power lines 370 and 470 and the other lines is substantially prevented, thus substantially preventing a malfunction of sub-pixels. Also, in the above-described structure, since the same voltage is applied to the power line 370 and the power line 470, there is no concern about a malfunction due to a short circuit between the power line 370 and the power line 470.

A first sub-pixel including the first TR 350, the third TR 310, and the electroluminescent device 360 electrically connected to the first TR 350 can be interposed between the first power line 370 and the first line 320. A second sub-pixel including the second TR 450, the fourth TR 410, and the electroluminescent device 460 electrically connected to the second TR 450 can be interposed between the second power line 470 and the second line 420. In this case, the first sub-pixel and the second sub-pixel can be symmetric about the first line 370 and the second line 470. However, the first sub-pixel and the second sub-pixel may be positioned in other ways. The fist sub-pixel and the second sub-pixel may or may not bisymmetric.

Although all the TRs electrically connected to the electroluminescent devices in FIGS. 4 through 14 are p type TRs, the present invention is not limited to this. In other words, as illustrated in FIGS. 15 through 18, n-type TRs can be connected to an electroluminescent device. Alternatively, both n-type and p-type TRs can be connected to an electroluminescent device. Other various modifications are possible.

An active matrix electroluminescent display apparatus according to the present invention constructed as described above provide the following benefits.

First, two adjacent sub-pixels may share one line so that a short circuit between the power line and other lines, such as a data line, can be substantially prevented.

Second, since a short circuit between the power interconnection and other lines, such as a data line, can be substantially prevented, a malfunction, such as luminescence of an unselected sub-pixel, can be substantially prevented, enabling an original image to be more clearly displayed.

Third, since adjacent two sub-pixels may share one power line, the number of power lines can be reduced by half, thereby resulting in a simplified line structure.

Fourth, by arranging power lines, which are respectively connected to two adjacent sub-pixels, to be close to each other, a short circuit between the power lines and other lines, such as a data line, can be substantially prevented.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. An active matrix electroluminescent display apparatus comprising:
    first and second electroluminescent devices;
    a first transistor connected to the first electroluminescent device;
    a second transistor positioned adjacent to the first transistor and connected to the second electroluminescent device;
    a first data line;
    a second data line;
    a third transistor electrically connected to the first transistor and the first data line;
    a fourth transistor electrically connected to the second transistor and the second data line;
    first and second substantially parallel power lines positioned adjacent to one another between the first and second transistors to substantially prevent a short-circuit between the power lines and the first and second data lines, wherein the first power line is configured to provide current to the first electroluminescent device through the first transistor and the second power line is configured to provide current to the second electroluminescent device through the second transistor;
    a first capacitor connected to the first transistor and to the first power line, wherein the first capacitor comprises first and second electrodes, and wherein a first protrusion from the first power line toward the first data line forms the first electrode of the first capacitor and overlaps the second electrode of the first capacitor, wherein the second electrode of the first capacitor overlaps the first power line only at the first protrusion; and
    a second capacitor connected to the second transistor and to the second power line, wherein the second capacitor comprises first and second electrodes, and wherein a second protrusion from the second power line toward the second data line forms the first electrode of the second capacitor and overlaps the second electrode of the second capacitor, wherein the second electrode of the second capacitor overlaps the second power line only at the second protrusion,
    wherein the first data line is positioned opposite to a side of the first transistor where the first power line is positioned, and the second data line is positioned opposite to a side of the second transistor where the second power line is positioned.

2. The apparatus of claim 1 wherein a first sub-pixel including the first transistor, the electroluminescent device electrically connected to the first transistor, and the third transistor is positioned between the first power line and the first data line, and a second sub-pixel including the second transistor, the electroluminescent device electrically connected to the second transistor, and the fourth transistor is positioned between the second power line and the second data line.

3. The apparatus of claim 2, wherein the first sub-pixel and the second sub-pixel are symmetric about a center line between the first power line and the second power line.

4. The apparatus of claim 1, wherein the first transistor and the second transistor have different sizes.

5. The apparatus of claim 1, wherein the electroluminescent device electrically connected to the first transistor and the electroluminescent device electrically connected to the second transistor have different sizes.

6. The apparatus of claim 1, comprised by one of the following:
    a cell phone, a television, a computer monitor, and a game display.

7. An active matrix electroluminescent display apparatus comprising:
    a first sub-pixel comprising a first electroluminescent device and a first transistor connected to the first electroluminescent device, wherein the first electroluminescent device and the first transistor are located between a first data line and a first power line;
    a second sub-pixel comprising a second electroluminescent device and a second transistor connected to the second electroluminescent device, wherein the second electroluminescent device and the second transistor are located between a second data line and a second power line;
    a first capacitor connected to the first transistor and to the first power line, wherein the first capacitor comprises first and second electrodes, and wherein a first protrusion from the first power line toward the first data line forms the first electrode of the first capacitor and overlaps the second electrode of the first capacitor, wherein the second electrode of the first capacitor overlaps the first power line only at the first protrusion; and
    a second capacitor connected to the second transistor and to the second power line, wherein the second capacitor comprises first and second electrodes, and wherein a second protrusion from the second power line toward the second data line forms the first electrode of the second capacitor and overlaps the second electrode of the second capacitor, wherein the second electrode of the second capacitor overlaps the second power line only at the second protrusion,
    wherein the first and second power lines are positioned adjacent to one another between the first and second sub-pixels, and the first data line is positioned opposite to a side of the first transistor where the first power line is positioned, and the second data line is positioned opposite to a side of the second transistor where the second power line is positioned.

8. The apparatus of claim 7, wherein the first and second power lines are arranged to substantially prevent a short-circuit between the power lines and the first and second data lines.

9. The apparatus of claim 7, the first sub-pixel further comprising a first capacitor connected to the first transistor and to the first power line, wherein a protrusion from the first power line forms a first plate of the first capacitor; and the second sub-pixel further comprising a second capacitor connected to the second transistor and to the second power line, wherein a protrusion from the second power line forms a first plate of the second capacitor.

10. The apparatus of claim 7, the first sub-pixel further comprising a third transistor electrically connected to the first transistor; and the second sub-pixel further comprising a fourth transistor electrically connected to the second transistor.

11. The apparatus of claim 10, wherein the first data line electrically is connected to the third transistor; and the second line electrically is connected to the fourth transistor.

* * * * *

UNITED STATES PATENT AND TRADEMARK OFFICE
CERTIFICATE OF CORRECTION

PATENT NO. : 8,441,416 B2
APPLICATION NO. : 11/167436
DATED : May 14, 2013
INVENTOR(S) : Kang et al.

Page 1 of 1

It is certified that error appears in the above-identified patent and that said Letters Patent is hereby corrected as shown below:

In the Specification

In column 9, line 4, Change "a the" to --the--

In column 10, line 39, Change "fist" to --first--.

In the Claims

In column 12, line 60, In Claim 11, change "electrically is" to --is electrically--.

In column 12, line 61, In Claim 11, change "line electrically is" to --data line is electrically--.

Signed and Sealed this
Fifth Day of November, 2013

Teresa Stanek Rea
*Deputy Director of the United States Patent and Trademark Office*